US006933898B2

(12) United States Patent
Nantz et al.

(10) Patent No.: US 6,933,898 B2
(45) Date of Patent: Aug. 23, 2005

(54) ANTENNA FOR TIRE PRESSURE MONITORING WHEEL ELECTRONIC DEVICE

(75) Inventors: John S. Nantz, Brighton, MI (US); Qingfeng Tang, Novi, MI (US); Ronald O. King, Brownstown, MI (US); Riad Ghabra, Dearborn Heights, MI (US)

(73) Assignee: Lear Corporation, Southfield, MI (US)

( * ) Notice: Subject to any disclaimer, the term of this patent is extended or adjusted under 35 U.S.C. 154(b) by 183 days.

(21) Appl. No.: 10/322,005

(22) Filed: Dec. 17, 2002

(65) Prior Publication Data

US 2003/0164799 A1 Sep. 4, 2003

Related U.S. Application Data

(60) Provisional application No. 60/360,762, filed on Mar. 1, 2002.

(51) Int. Cl.[7] .............................................. H01G 1/32
(52) U.S. Cl. .......................... 343/711; 343/908; 340/442
(58) Field of Search ........................ 343/700 MS, 711, 343/713, 718, 705, 708, 907–908; 340/442, 446–447

(56) References Cited

U.S. PATENT DOCUMENTS

| 3,723,966 | A | | 3/1973 | Mueller et al. ................ 340/58 |
| 4,334,215 | A | * | 6/1982 | Frazier et al. ............... 340/447 |
| 4,578,992 | A | * | 4/1986 | Galasko et al. ............ 73/146.5 |
| 4,609,905 | A | | 9/1986 | Uzzo ........................... 340/58 |
| 4,646,359 | A | | 2/1987 | Furrer ........................ 455/108 |
| 4,684,853 | A | | 8/1987 | Coash ......................... 318/16 |
| 4,761,830 | A | | 8/1988 | Izumi ......................... 455/343 |
| 4,896,372 | A | | 1/1990 | Weaver ....................... 455/108 |
| 5,515,014 | A | | 5/1996 | Troutman .................... 332/178 |
| 5,531,109 | A | | 7/1996 | Tsagas .................... 318/568.11 |
| 5,562,787 | A | * | 10/1996 | Koch et al. .................... 156/64 |
| 5,573,610 | A | * | 11/1996 | Koch et al. ............... 152/152.1 |
| 5,573,611 | A | * | 11/1996 | Koch et al. ............... 152/152.1 |
| 5,612,671 | A | | 3/1997 | Mendez et al. ............. 340/447 |
| 5,661,651 | A | | 8/1997 | Geschke et al. ...... 364/424.034 |
| 5,708,403 | A | | 1/1998 | Morozumi et al. .......... 333/194 |
| 5,883,305 | A | | 3/1999 | Jo et al. ...................... 73/146.5 |
| 5,920,234 | A | | 7/1999 | Hill .............................. 331/75 |
| 5,929,620 | A | | 7/1999 | Dobkin et al. .............. 323/288 |
| 6,034,597 | A | * | 3/2000 | Normann et al. ........... 340/447 |
| 6,078,226 | A | | 6/2000 | Ajjikuttira .................. 331/179 |
| 6,112,587 | A | * | 9/2000 | Oldenettel ................. 73/146.5 |

(Continued)

FOREIGN PATENT DOCUMENTS

| DE | 4232240 A | 3/1994 |
| EP | 0 016 991 A | 10/1980 |
| EP | 0 646 985 A1 | 4/1995 |
| EP | 0671289 A1 | 9/1995 |
| EP | 0 753 897 A2 | 1/1997 |

(Continued)

OTHER PUBLICATIONS

William Schweber, Electronic Communication Systems, 1991, Prentice–Hall, Inc., pp. 91–93.
U.K. Patent Office Search Report dated Jun. 27, 2003.

*Primary Examiner*—Thuy Vinh Tran
(74) *Attorney, Agent, or Firm*—Bill C. Panagos

(57) ABSTRACT

An antenna system for a radio frequency (RF) electronic device includes a printed circuit board (PCB), a ground plane, and an active element. The PCB has a top surface and a bottom surface. The ground plane is on the bottom surface. The active element is mounted on the top surface. The active element includes a first segment positioned in a top surface plane and connected to a second segment oriented perpendicular to the top surface.

9 Claims, 1 Drawing Sheet

U.S. PATENT DOCUMENTS

| | | |
|---|---|---|
| 6,239,753 B1 | 5/2001 | Kado et al. ............... 343/702 |
| 6,362,731 B1 | 3/2002 | Lill ........................... 340/445 |
| 6,369,703 B1 | 4/2002 | Lill ........................... 340/447 |
| 6,384,720 B1 | 5/2002 | Juzswik et al. ........... 340/442 |
| 6,408,690 B1 | 6/2002 | Young et al. ............. 73/146.5 |
| 6,441,728 B1 | 8/2002 | Dixit et al. ............... 340/447 |
| 6,501,372 B2 | 12/2002 | Lin ........................... 340/442 |
| 6,518,877 B1 * | 2/2003 | Starkey et al. ........... 340/447 |
| 6,543,279 B1 * | 4/2003 | Yones et al. .............. 73/146.5 |
| 6,571,617 B2 | 6/2003 | Van Nickerk et al. ... 73/146 |
| 6,581,449 B1 | 6/2003 | Brown et al. ............. 73/146 |
| 6,612,165 B2 | 9/2003 | Juzswik et al. ........... 73/146.5 |
| 6,630,885 B2 * | 10/2003 | Hardman et al. ......... 340/505 |
| 2001/0008083 A1 | 7/2001 | Brown ....................... 73/146 |
| 2003/0020605 A1 | 1/2003 | Starkey .................... 340/447 |
| 2003/0201879 A1 * | 10/2003 | Munch et al. ............. 340/442 |

FOREIGN PATENT DOCUMENTS

| | | |
|---|---|---|
| EP | 0 760 299 A1 | 5/1997 |
| EP | 0995619 A1 | 4/2000 |
| EP | 1 113 582 A2 | 7/2001 |
| EP | 1 262 339 A1 | 4/2002 |
| EP | 1 211 104 A2 | 6/2002 |
| EP | 1 215 056 A3 | 6/2002 |
| EP | 1 215 056 A2 | 6/2002 |
| EP | 1 267 021 A1 | 12/2002 |
| FR | 2801728 A | 6/2001 |
| GB | 1483735 | 8/1977 |
| GB | 2179480 A | 3/1987 |
| GB | 2318696 A | 4/1998 |
| GB | 2363463 A | 12/2001 |
| GB | 2381972 A | 5/2003 |
| JP | 260212 A1 | 2/1990 |
| JP | 8244424 A | 3/1995 |
| JP | 10-107548 A | 4/1998 |
| JP | 2001-007712 A | 1/2001 |
| WO | WO 91/08614 | 6/1991 |
| WO | WO 96/15919 | 5/1996 |
| WO | WO 99/29523 | 6/1999 |
| WO | WO 01/26069 A1 | 4/2001 |
| WO | WO 01-76007 A1 | 10/2001 |
| WO | WO 01/81104 A1 | 11/2001 |
| WO | WO 02/072369 A1 | 9/2002 |

* cited by examiner

ANTENNA FOR TIRE PRESSURE MONITORING WHEEL ELECTRONIC DEVICE

CROSS-REFERENCE TO RELATED APPLICATION

This application claims the benefit of U.S. provisional application Ser. No. 60/360,762 filed Mar. 1, 2002.

BACKGROUND OF THE INVENTION

1. Field of the Invention

The present invention relates to a system and method for an antenna for a tire pressure monitoring device having reduced coupling to metal objects.

2. Background Art

It is known in the automotive industry to provide for wireless monitoring of vehicle tire parameters, particularly tire pressure. In such tire pressure monitoring systems, tire pressure sensors and radio frequency (RF) transmitters including antennas are mounted inside each tire, typically adjacent the inflation valve stem on or near a metal wheel rim. In each tire, the tire pressure sensed by the tire pressure sensor is transmitted as an RF signal by the transmitter through the antenna to a receiver/controller located on the vehicle. The tire pressure information delivered to the receiver/controller by the RF signals from the transmitters is subsequently conveyed to a vehicle operator or occupant, typically using a display unit. In such a fashion, tire pressure monitoring systems can help to improve vehicle safety. Exemplary tire pressure monitoring systems are described and shown in U.S. Pat. Nos. 6,112,587 and 6,034,597.

Remote keyless entry (RKE) systems are also well known in the automotive industry. RKE systems include an RF transmitter used by the vehicle operator or occupant to transmit signals that control such functions as door, trunk, etc. locking/unlocking, turning on/off lights, sounding an alert, arming/disarming an anti-theft system, etc. and a receiver/controller in the vehicle that processes the transmitter control signals. The conventional RKE receiver includes an RF antenna that is generally positioned or mounted on or near metal objects such as exterior body sheet metal, internal body structural metal, metal door skins, etc.

Conventional RF antennas that are mounted near metal objects (e.g., the tire pressure monitoring device antennas that are mounted on the vehicle wheel rims, the RKE antennas that are mounted on body sheet metal, etc.) are de-tuned from one application to the next because of metal coupling between active (i.e., radiating or receiving) antenna elements and the metal near the antenna.

Thus, there exits a need for a system and method for an antenna for a tire pressure monitoring wheel electronic device and RKE applications that, when mounted on or near metal such as the rim of the wheel or body sheet metal, reduces or eliminates the metal coupling between the antenna element and the metal. Such an antenna would reduce the de-tuning due to the metal coupling and improve the antenna efficiency and performance when compared to conventional RF antenna approaches.

SUMMARY OF THE INVENTION

The present invention provides an improved system and method for an antenna assembly that is generally implemented in connection with a vehicle tire pressure monitoring wheel transmitter (or similar electronic device) and mounted on or near the rim of a wheel. The antenna system of the present invention generally reduces or eliminates the coupling between the antenna element and the wheel rim and, thus, reduces de-tuning and improves the antenna efficiency and performance when compared to conventional RF antenna approaches. The improved antenna assembly of the present invention may be advantageously implemented in any system having a radio frequency (RF) transmitter or receiver antenna that is mounted on or near metal such as a remote keyless entry (RKE) receiver.

According to the present invention, an antenna system for a radio frequency (RF) electronic device is provided, the system comprising a printed circuit board (PCB), a ground plane, and an active element. The PCB may have a top surface and a bottom surface. The ground plane may be on the bottom surface. The active element may be mounted on the top surface. The active element comprises a first segment positioned in a top surface plane and connected to a second segment oriented perpendicular to the top surface.

Also according to the present invention, for use in a vehicle tire pressure monitoring electronic device, an antenna system is provided comprising a printed circuit board (PCB), a ground plane, and an active element. The PCB may have a top surface and a bottom surface. The ground plane may be on the bottom surface. The active element may be mounted on the top surface, wherein the active element comprises a first segment positioned in a top surface plane and connected to a second segment oriented perpendicular to the top surface, and the bottom surface is mounted on or near a wheel rim.

Further, according to the present invention, for use in a vehicle tire pressure monitoring system, a method of reducing coupling between an antenna and a metal object is provided, the method comprising providing a printed circuit board (PCB) having a top surface and a bottom surface, providing a ground plane on the bottom surface, mounting an active element on the top surface, wherein the active element comprises a first segment positioned in a top surface plane and connected to a second segment oriented perpendicular to the top surface, and mounting the bottom surface on or near a wheel rim.

The above features, and other features and advantages of the present invention are readily apparent from the following detailed descriptions thereof when taken in connection with the accompanying drawings.

DETAILED DESCRIPTION OF THE PREFERRED EMBODIMENT(S)

With reference to the Figures, the preferred embodiments of the present invention will now be described in detail. As previously noted, it is known in the automotive industry to provide for wireless monitoring of vehicle tire parameters, particularly tire pressure. In such tire pressure monitoring systems, tire pressure sensors and radio frequency (RF) transmitters including antennas are mounted inside each tire, typically adjacent the inflation valve stem on or near a metal wheel rim. In each tire, the tire pressure sensed by the tire pressure sensor is transmitted by the transmitter through the antenna to a receiver/controller located on the vehicle. The tire pressure information delivered to the receiver/controller by the RF signals from the transmitters is subsequently conveyed to a vehicle operator or occupant, typically using a display unit.

As previously noted, conventional remote keyless entry (RKE) systems include an RF transmitter used by the vehicle operator or occupant to transmit signals that control such functions as door, trunk, etc. locking/unlocking, turning on/off lights, sounding an alert, arming/disarming an anti-theft system, etc. and a receiver/controller in the vehicle that processes the transmitter control signals. The conventional RKE receiver includes an RF antenna that is generally positioned or mounted on or near metal objects such as exterior body sheet metal, internal body structural metal, metal door skins, etc.

Conventional RF antennas that are mounted near metal objects (e.g., the tire pressure monitoring device antennas that are mounted on the vehicle wheel rims, the RKE antennas that are mounted on body sheet metal, etc.) are de-tuned from one application to the next because of metal coupling between active (i.e., radiating) antenna elements and the metal near the antenna.

Generally, the present invention provides an improved system and method for the antenna that is mounted on or near the rim of the wheel and implemented in connection with the vehicle tire pressure monitoring wheel electronic device (i.e., the transmitter) or the antenna that is mounted on or near body sheet metal or structural metal in connection with an RKE receiver. The antenna system of the present invention generally reduces or eliminates the coupling between the antenna element and the metal and, thus, reduces de-tuning and improves the antenna efficiency and performance when compared to conventional antenna approaches.

Figure 1:
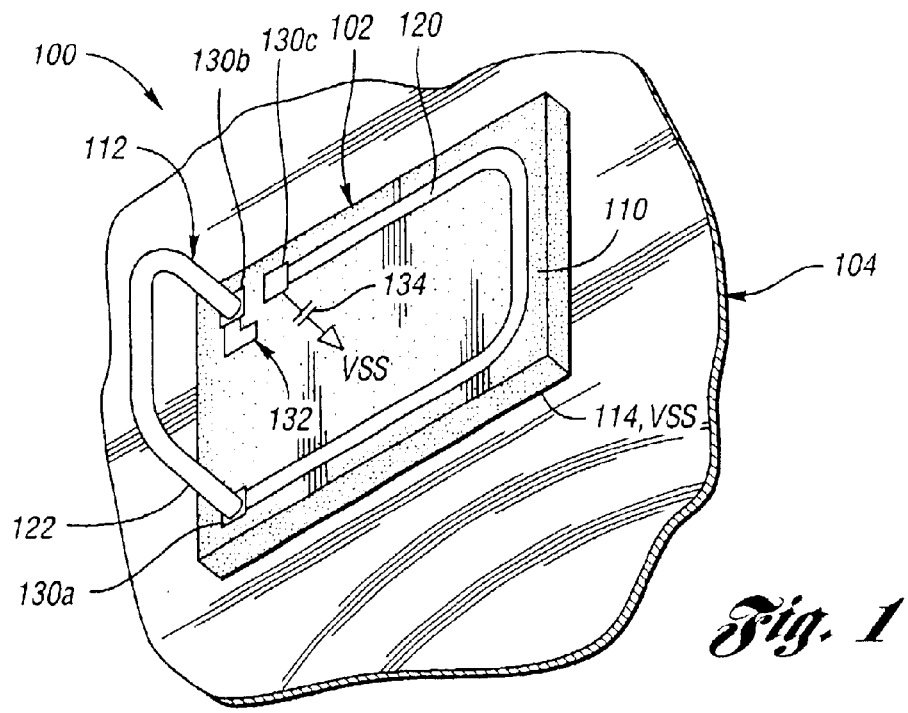
FIG. 1 is a diagram of a preferred embodiment of the present invention.

Referring to FIG. 1, a diagram illustrating an antenna system 100 in accordance with a preferred embodiment of the present invention are shown. In one example, the system 100 may be implemented in connection with a vehicle tire pressure monitoring wheel electronic device such as a transmitter or a transmitter/receiver (not shown) that is mounted on or near a rim of the wheel (e.g., internal to the respective tire). In another example, the system 100 may be implemented in connection with an RKE system antenna that is mounted on or near metal such as body sheet metal or body structural metal. The system 100 generally comprises an antenna assembly (or apparatus) 102 mounted on or near a metal object 104.

In one example (i.e., the tire pressure monitoring system), the object 104 is a rim of a wheel that has a respective tire pressure monitored by the vehicle tire pressure monitoring wheel electronic device. In another example (i.e., a remote keyless entry (RKE) system, not shown), the object 104 may be any appropriate vehicle metal surface (e.g., body sheet metal, metal door skin, etc.). However, the system 100 of the present invention may be advantageously implemented in connection with any appropriate radio frequency (RF) transmitter or receiver that is mounted on or very near to metal.

The assembly 102 generally comprises a printed circuit board (PCB) 110 having an upper surface (or top side) and a lower surface (or bottom side). An antenna element 112 is generally mounted on (or to) the upper surface of the PCB 110. The lower surface of the PCB 110 generally comprises a ground plane 114. The ground plane 114 is generally at a ground potential (e.g., VSS). In one example, the ground plane 114 on the bottom surface of the PCB covers the lower surface of the PCB 110. The antenna element 112 generally comprises an active portion of the system 100 (i.e., a portion or section of the system 100 that receives or transmits at least one RF signal).

The element 112 generally comprises a first segment (portion, section, etc.) 120 that may be mounted to the top side of the PCB 110 (i.e., positioned in the plane of the top surface and substantially parallel to the ground plane 114) and a second segment (or portion) 122 that may be oriented substantially perpendicular to the top side of the PCB 110. The segments 120 and 122 are each generally "C" or "U" shaped. The segments 120 and 122 are connected in series and generally approximately equal in length.

A mounting (or connecting) tab 130a generally forms an interconnect between the segments 120 and 122. The tab 130a also generally provides a mount for an end of the segment 122 to the PCB 110. A mounting (or connecting) tab 130b generally terminates an end of the segment 122 that is opposite the tab 130a and provides another mount for the segment 122 to the PCB 110. A mounting (or connecting) tab 130c generally terminates an end of the segment 120 that is opposite the tab 130a. The segment 122 generally forms an arch between the tabs 130a and 130b. However, the element 112 may be implemented having any appropriate segment 120 and 122 shapes and configurations in connection with the ground plane 114 to meet the design criteria of a particular application.

The tab 130b may be connected to a terminal 132. The terminal 132 generally provides a signal input/output connection from the antenna active element 112 to an electronic device (e.g., transmitter or receiver) that generates and receives the at least one RF signal that is transmitted (or radiated) and received by the antenna 112. The tab 130c may be connected to a first terminal of a capacitance 134. The capacitance 134 may have a second terminal that is connected to the ground potential VSS. The capacitance 134 generally comprises a tuning capacitance for the system 100.

The bottom (or lower) surface ground plane 114 is generally mounted (i.e., fixed, positioned, fastened, etc.) to the metal 104. The ground plane 114 and the metal 104 may couple to form an effectively larger ground plane and, in connection with the segment 122 which is generally perpendicular to the ground plane, a more efficient antenna system than conventional antenna approaches.

Figure 2:
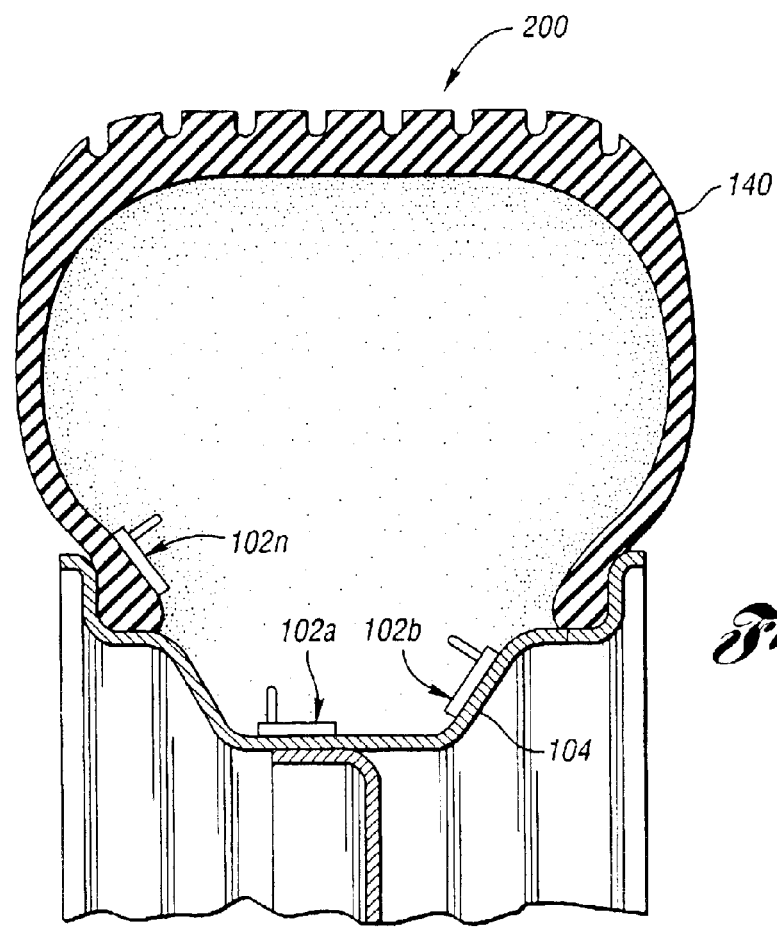
FIG. 2 is a diagram illustrating alternative applications of the present invention.

Referring to FIG. 2, a diagram illustrating a cross section of a vehicle wheel 200 implemented in connection with the present invention showing alternative mounting positions for the antenna assembly 102. The vehicle wheel 200 may be one of a plurality of wheels where tire parameters, especially tire air pressure, are monitored by a tire pressure monitoring system. The system 100 is generally implemented with one assembly 102 per wheel 200 on the vehicle having the tire pressure monitoring system. The wheel 200 generally has at least one assembly 102 (e.g., assemblies 102a–102n) mounted inside a tire 140 that is mounted to the rim 104.

In one example, the assembly 102a may be mounted to a portion of the rim 104 that is substantially parallel to the tread surface of the tire 140. In another example, the assembly 102b may be mounted on the rim 104 near the tire 140 bead retention flange. In yet another example, the assembly 102n maybe mounted on the tire 140 near the rim 104 (e.g., at or near the bead). The example mounting positions shown in FIG. 2 are only illustrative of many positions on or near metal 104 that the antenna assembly 102 may be mounted. The present invention is not intended to be limited to the positions shown. The assembly 102 of the present invention generally includes the ground plane 114 on the bottom surface of PCB 110 that is positioned on or near the rim 104 and, thereby, improves the antenna radiation and reception efficiency instead of reducing the efficiency as in conventional antenna approaches.

In another example (e.g., an implementation of the system 100 in connection with an RKE system, not shown), the assembly 102 may be mounted on or near any appropriate metal surface (e.g., door skin, body sheet metal, body structural metal, etc.) to meet the design criteria of a particular application.

As is readily apparent from the foregoing description, then, the present invention generally provides an improved antenna system (e.g., the system 100) that may be especially advantageous when implemented in connection with a vehicle tire pressure monitoring system or vehicle RKE system. However, the antenna assembly 102 may be implemented in connection with any appropriate transmitter and receiver to meet the design criteria of a particular application. In particular, the assembly 102 generally improves antenna efficiency and reduces or eliminates frequency detuning when mounted on or near metal surfaces when compared to conventional RF antenna assemblies.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An antenna system for a tire pressure monitoring radio frequency (RF) electronic device, the system comprising:
   a printed circuit board (PCB) having a top surface and a bottom surface;
   a ground plane on the bottom surface; and
   an active element mounted on the top surface, wherein the bottom surface is mounted on or near a metal object, the active element comprises a first "C" or "U" shaped segment positioned in a top surface plane and connected in series to a second "C" or "U" shaped segment that comprises an arch, the arch is curved in a plane, the plane on which the arch is curved is oriented perpendicular to the top surface to reduce coupling between the antenna system and the metal object, and the metal object comprises a wheel rim.

2. The system of claim 1 wherein the system further comprises a tuning capacitance connected between the first segment and the ground plane.

3. The system of claim 1 wherein the system further comprises an input/output connection at an end of the second segment opposite the first segment for connection to the electronic device.

4. For use in a vehicle tire pressure monitoring electronic device, an antenna system comprising:
   a printed circuit board (PCB) having a top surface and a bottom surface;
   a ground plane on the bottom surface; and
   an active element mounted on the top surface, wherein the active element comprises a first "C" or "U" shaped segment positioned in a top surface plane and connected in series to a second "C" or "U" shaped segment that comprises an arch, the arch is curved in a plane, the plane on which the arch is curved is oriented perpendicular to the top surface to reduce coupling between the antenna system and a metal object, and the bottom surface is mounted on or near the metal object which comprises a wheel rim.

5. The system of claim 4 wherein the system further comprises a tuning capacitance connected between the first segment and the ground plan.

6. The system of claim 4 wherein the system further comprises an input/output connection at an end of the second segment opposite the first segment for connection to the electronic device.

7. For use in a vehicle tire pressure monitoring system, a method of reducing coupling between an antenna and a metal object, the method comprising:
   providing a printed circuit board (PCB) having a top surface and a bottom surface;
   providing a ground plane on the bottom surface; and
   mounting an active element on the top surface, wherein the bottom surface of the PCB is mounted on or near a metal object comprising a wheel rim, the active element comprises a first "C" or "U" shaped segment positioned in a top surface plane and connected in series to a second "C" or "U" shaped segment that comprises an arch, the arch is curved in a plane, and the plane on which the arch is curved is oriented perpendicular to the top surface.

8. The method of claim 7 further comprising providing a tuning capacitance connected between the first segment and the ground plane.

9. The method of claim 7 further comprising providing an input/output connection at an end of the second segment opposite the first segment.

* * * * *

UNITED STATES PATENT AND TRADEMARK OFFICE
CERTIFICATE OF CORRECTION

PATENT NO. : 6,933,898 B2
DATED : August 23, 2005
INVENTOR(S) : John S. Nantz et al.

It is certified that error appears in the above-identified patent and that said Letters Patent is hereby corrected as shown below:

<u>Column 6,</u>
Line 20, delete "plan" and insert -- plane --.

Signed and Sealed this

Eighth Day of November, 2005

JON W. DUDAS
*Director of the United States Patent and Trademark Office*